(12) United States Patent
Guidash (10) Patent No.: US 6,307,195 B1
(45) Date of Patent: Oct. 23, 2001

(54) VARIABLE COLLECTION OF BLOOMING CHARGE TO EXTEND DYNAMIC RANGE

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/426,833

(22) Filed: Oct. 26, 1999

(51) Int. Cl.⁷ .................................................. H01L 27/00
(52) U.S. Cl. .................................... 250/208.1; 348/308
(58) Field of Search .......................... 250/208.1, 214 R, 250/214.1; 348/308, 302, 297, 298; 257/291, 230, 223

(56) References Cited

U.S. PATENT DOCUMENTS

| 5,650,643 | 7/1997 | Konuma | 257/225 |
| 5,892,541 | * 4/1999 | Merrill | 348/302 |

OTHER PUBLICATIONS

Orly Yadid–Pecht et al., "Wide Intrascene Dynamic Range CMOS APS Using Dual Sampling"; 1997 IEEE Workshop on Charge–Coupled Devices and Advanced Image Sensors; paper #R15.{Month unknown}.

Sypros Kavadias et al., "On–chip Offset Calibrated Logarithmic Response Image Sensor", 1999 IEEE Workshop on Charge–Coupled Devices and Advanced Image Sensors, pp. 68–71. (Month unknown).

M. Loose et al., "Self–Calibrating Logarithmic CMOS Image Sensor with Single Chip Camera Functionality", 1999 IEEE Workshop on Charge–Coupled Devices and Advanced Image Sensors, pp. 191–194. (Month unknown).

N. Ricquier, et al., "Active Pixel CMOS Image Sensor with On–Chip Non–Uniformity Correction", 1995 IEEE Workshop on Charge–Coupled Devices and Advanced Image Sensors. (Month unknown).

J. Huppertz et al., "Fast CMOS Imaging with High Dynamic Range", 1997 IEEE Workshop on Charge–Coupled Devices and Advanced Image Sensors, pp. 1–4. (Month unknown).

S. Decker et al., "Comparison of CCD and CMOS Pixels for a Wide Dynamic Range Area Imager", 1995 IEEE Workshop on Charge–Coupled Devices and Advanced Image Sensors, pp. 1–5. (Month unknown).

S. Decker et al., "A 256×256 CMOS Imaging Array with Wide Dynamic Range Pixels and Column–Parallel Digital Output", IEEE Journal of Solid–State Circuits, vol. 33, No. 12, Dec. 1998, pp. 2081–1091.

* cited by examiner

*Primary Examiner*—Que T. Le
(74) *Attorney, Agent, or Firm*—Peyton C. Watkins (57) ABSTRACT

A method and apparatus of employing an X-Y addressable MOS imager to obtain increased dynamic range wherein the X-Y addressable imager as a semiconductor based sensor having an array of pixels formed in rows and column, with a plurality of the pixels formed such that each pixel within the plurality of pixels has a photodetector, a sense node and a transfer mechanism for transferring charge from the photodetector to the sense node, and with a reset mechanism for resetting the sense node to a predetermined potential. An integration period for the photodetector is initiated through operation of the transfer mechanism followed by initiating an integration period for the sense node through operation of the reset mechanism and reading charge from both sense node and photodetector accumulated during their respective integration periods.

39 Claims, 10 Drawing Sheets

VARIABLE COLLECTION OF BLOOMING CHARGE TO EXTEND DYNAMIC RANGE

CROSS-REFERENCE TO RELATED APPLICATIONS

The present application is related to U.S. application Ser. No. 09/426,870, filed Oct. 26, 1999, by Robert M. Guidash, and entitled, CMOS IMAGE SENSOR WITH EXTENDED DYNAMIC RANGE.

FIELD OF THE INVENTION

The present invention pertains to semiconductor based image sensors and more particularly to Active Pixel image sensors (APS) or Passive Pixel image sensors (PPS) having increased dynamic range.

BACKGROUND OF THE INVENTION

APS are solid state imagers wherein each pixel contains both a photo-sensing means and at least one other active component, creating a charge that is converted to a signal (either a voltage or current signal). The signal represents the amount of light incident upon a pixel photosite. The dynamic range (DR) of an image sensing device is defined as the ratio of the effective maximum detectable signal level, typically referred to as the saturation signal, ($V_{sat}$), with respect to the rms. noise level of the sensor, ($\sigma_{noise}$). This is shown in Equation 1.

$$\text{Dynamic Range} = V_{sat}/\sigma_{noise} \qquad \text{Equation 1}$$

Image sensor devices such as charge coupled devices (CCD) that integrate charge created by incident photons have dynamic range limited by the amount of charge that can be collected and held in a given photosite, ($V_{sat}$). For example, for any given CCD, the amount of charge that can be collected and detected in a pixel is proportional to the pixel area. Thus for a commercial device used in a mega-pixel digital still camera (DSC), the number of electrons representing Vsat is on the order of 13,000 to 20,000 electrons. If the incident light is very bright and creates more electrons that can be held in the pixel or photodetector, these excess electrons are extracted by the anti-blooming means in the pixel and do not contribute to an increased saturation signal. Hence, the maximum detectable signal level is limited to the amount of charge that can be held in the photodetector or pixel. The DR is also limited by the sensor noise level, $\sigma_{noise}$. Due to the limitations on Vsat, much work has been done in CCD's to decrease $\sigma_{noise}$ to very low levels. Typically, commercial megapixel DSC devices have a DR of 1000:1 or less.

The same limitations on DR exist for APS devices. The $V_{sat}$ is limited by the amount of charge that can be held and isolated in the photodetector. Excess charge is lost. This can become even more problematic with APS compared to CCD due to the active components within the pixel in the APS, limiting the area available for the photodetector, and due to the low voltage supply and clocks used in APS devices. In addition, since APS devices have been used to provide image sensor systems on a chip, the digital and analog circuits used on APS devices such as timing and control and analog to digital conversion, that are not present on CCD's, provide a much higher noise floor on APS devices compared to CCD. This is due to higher temporal noise as well as possibly quantization noise from the on-chip analog to digital converter.

Within the art of semiconductor based image sensors there are numerous disclosures that provide extended dynamic range for both APS and PPS devices. These include (1) measurement of number of clock periods to reach a threshold as taught by Konuma in U.S. Pat. No. 5,650,643; (2) capture of 2 or more correlated images with varying integration times as described by Orly Yadid-Pecht et al. in "Wide Intrascene Dynamic Range CMOS APS Using Dual Sampling" published in the 1997 IEEE Workshop on Charge-Coupled Devices and Advanced Image Sensors; paper #R15; (3) logarithmic transfer function pixel architectures as described by Sypros Kavadias et al. in "On-chip Offset Calibrated Logarithmic Response Image Sensor", 1999 IEEE Workshop on Charge-Coupled Devices, and Advanced Image Sensors, pp. 68–71, M. Loose et al., "Self-Calibrating Logarithmic CMOS Image Sensor with Single Chip Camera Functionality", 1999 IEEE Workshop on Charge-Coupled Devices and Advanced Image Sensors, pp. 191–194, N. Ricquier, et al., "Active Pixel CMOS Image Sensor with On-Chip Non-Uniformity Correction", 1995 IEEE Workshop on Charge-Coupled Devices and Advanced Image Sensors, J. Huppertz et al., "Fast CMOS Imaging with High Dynamic Range", 1997 IEEE Workshop on Charge-Coupled Devices and Advanced Image Sensors, pp. 1–4; and (4) varying the level of the reset gate during integration as described in prior art references by S. Decker et al., "Comparison of CCD and CMOS Pixels for a Wide Dynamic Range Area Imager", 1995 IEEE Workshop on Charge-Coupled Devices and Advanced Image Sensors, and "A 256×256 CMOS Imaging Array with Wide Dynamic Range Pixels and Column-Parallel Digital Output", IEEE Journal of Solid State Circuits, Vol 33, No. 12, December 1998.

U.S. Pat. No. 5,650,643 issued to Konuma (Konuma) teaches a device that can be used to increase the dynamic range of solid state image sensing devices. Konuma shows a means to increase the effective $V_{sat}$ level by incorporating a comparator and a counter associated with a photodetector to measure the time required to reach an integrated signal threshold level, and provide this as the only sensor output. The counter is used in conjunction with the comparator to determine the number of counter clock periods that it took the photodetector to reach the signal level of that supplied to the comparator input. The device then provides only the number of counter clock periods as an output or signal value associated with the photodetector.

While the disclosure of Konuma does provide increased dynamic range through effectively increasing $V_{sat}$, this approach has several problems.

First, if one were to have a counter and comparator in each pixel, the number of components in each pixel is very large leading to a pixel with a very small fill factor or a very large pixel. This approach is not practical given the present minimum feature sizes of state of the art semiconductor technology, and the need for small pixel, low cost image sensors.

Second, the output for each pixel is a counter value for the time required to reach a given threshold, and does not contain an analog output value for the actual amount of charge integrated in the photodetector. With this approach, although the effective $V_{sat}$ level is increased, the effective DR will be limited by the time period or accuracy of the counter clock, and the size of the counter. For example, if the counter has 10 bits or 1024 counts, the dynamic range is extended to 10 bits provided that the 1024 master clock periods can fit into the desired exposure time. If the desired exposure time were 100 msec., then the counter clock period must be $\leq 97.6$ usec. If one were try to extend the DR to 20 bits, a 20 bit counter would be required, and a counter clock frequency of >10.5 MHz for an exposure time of 100 msec. In this example, the extension of the DR from 10 to bits results in a clock frequency requirement that is 1000 times faster. As the exposure time decreases a commensurately faster master clock is required. For example, if an exposure time of $\frac{1}{60}^{th}$ of a second were desired or required in the case of capturing an image in outdoors in bright sunlight, a master clock of 63 MHz would be required to quantize 20 bits. It is evident that very fast counter clocks are required to provide high dynamic range in typical exposure conditions. Also, as the number of bits in the counter gets larger, more area required to integrate this into the pixel, producing a larger and larger pixel Typical counters require 4–8 transistors per bit. Thus a 20 bit counter would require 80–160 transistors, yielding pixel sizes of >40 um in a 0.35 um CMOS process. Additionally this approach requires that all pixels within the image sensor reach the programmed threshold level in order to have an output value for each pixel. This would require very long exposure times to allow dark regions of the scene to reach the threshold level if the threshold level is near $V_{sat}$. The exposure times could be decreased by programming the threshold level to a very low value, but this would reduce the accuracy of information in very bright regions of the scene since they will reach the threshold value in extremely short time periods.

Thirdly, with the approach of Konuma, at the brightest light levels the data is more quantized. This is shown is Equation 2 by looking at how the effective light measurement is calculated from the time to threshold.

If one knows the amount of time ($t_T$) required to reach a threshold ($V_T$) and assume that the source is constant over the time being measured, then one can calculate the amount of light at any arbitrary time, ($t_M$). The expression for the extended effective voltage ($V_{ext}$) is given by Equation 2 below.

$$V_{est} = \frac{V_T \cdot t_M}{t_T}$$ Equation 2

In a discrete system the time variable, $t_T$, would be measured by a quantized unit as indicated in Equation 3.

$$t_T = \frac{t_M \cdot cv}{MaxCv}$$ Equation 3

Where cv is the quantized integer code value and MaxCv is the code value that corresponds to the cv value at $t_M$. Substituting values we arrive at Equation 4.

$$V_{ext} = \frac{V_T \cdot MaxCv}{cv}$$ Equation 4

Referring to FIG. 2, a code value (cv) of zero implies infinite light. The first measurable quantization, which is also the largest, is between cv=1 and cv=2. The quantization for an 8 bit linear system is 0.0039, which is less than the smallest quantization in a time to threshold method described by Konuma.

Fourthly, if one were to have a single counter and comparator used outside of the pixel array to keep track of the time to threshold, each pixel would then have to be measured at an extremely high rate in order to have a small enough sampling frequency per pixel to provide fine enough quantization for extension of the dynamic range. For example, assume that 10 bits of quantization over the desired exposure time is required, and that there are 1 million pixels in the image sensor. Given a desired exposure time of 100 msec., each pixel would have to be accessed and measured against the programmed threshold level every 97.65 usec. This means that 1 million pixels need to be sampled every 97.65 usec. This would require a pixel sampling rate of 1 pixel per 97.65 psec, or 10.24 GHz. A means for doing this is not disclosed by Konuma or elsewhere in the field of APS devices or other image sensor devices.

Finally, the output value provided is a time. In order to reconstruct the incident image from this output, (i.e. determine the signal level), one must extrapolate by multiplication from the time value. This can degrade the effective noise level of the sensor. The value t is used to measure the time for a voltage v(t) to reach to a threshold. The signal VPD(t) represents the accumulation of photons over time with some Gaussian additive noise with a standard deviation of $\sigma_v$. One experienced in the art can show that the noise in the extended voltage domain ($\sigma_{Ext}$) is related to the additive noise as indicated by Equation 5.

$$\sigma_{Ext} = \frac{2 \cdot \sigma_v \cdot t_M \cdot V_T^2}{t_T \cdot (V_T^2 - \sigma_v^2)}$$ Equation 5

Given that $t_M$ is always greater than $t_T$ one can see that the value of $\sigma_{Ext}$ is always greater than $\sigma_v$. From the foregoing discussion it should be apparent that there remains a need within the prior art for a device that provides extended $V_{sat}$ and dynamic range while retaining low noise, small pixel, simple and low frequency readout, and means to manage the quantization of extended voltage signals.

With the method of capturing 2 or more frames as disclosed by prior art references: Orly Yadid-Pecht et al. in "Wide Intrascene Dynamic Range CMOS APS Using Dual Sampling"; 1997 IEEE Workshop on Charge-Coupled Devices and Advanced Image Sensors; paper #R15; O. Pecht et al., "CMOS APS with Autoscaling and Customized Wide Dynamic Range", 1999 IEEE Workshop on Charge-Coupled Devices and Advanced Image Sensors; and M. Schantz et al., "256×256 CMOS Imager with Linear Readout and 120 dB Dynamic Range", 1999 IEEE Workshop on Charge-Coupled Devices and Advanced Image Sensors, two or more frames of the same image or scene with different integration times are captured, multiple readouts are required and the integration times for each readout must be chosen in accordance with the scene illuminance in order to get an accurate interpolation. This adds complexity to the imaging auto-exposure system to facilitate rapid choice of integration times and has not been shown in the art. Also, additional frame memory is required to perform the multiple frame output comparison and calculation of effective signal level. Additionally, if there is any motion or change in scene illuminance between the 2 frames, this method of extending dynamic range will not work.

With the methods of extending dynamic range described by: Sypros Kavadias et al., "On-chip Offset Calibrated Logarithmic Response Image Sensor", 1999 IEEE Workshop on Charge-Coupled Devices and Advanced Image Sensors, pp. 68–71; M. Loose et al., "Self-Calibrating Logarithmic CMOS Image Sensor with Single Chip Camera Functionality", 1999 IEEE Workshop on Charge-Coupled Devices and Advanced Image Sensors, pp. 191–194; and N. Ricquier, et al., "Active Pixel CMOS Image Sensor with On-Chip Non-Uniformity Correction", 1995 IEEE Workshop on Charge-Coupled Devices and Advanced Image Sensors, a pixel with a logarithmic transfer function is provided. This approach of using a MOSFET sub-threshold exhibits behavior having very high fixed pattern noise. Approaches to correct this require extra system memory, individual threshold trimming of each pixel, or extra transistors per pixel. This increases chip size as well as system cost and complexity.

With the methods of extending dynamic described by J. Huppertz et al., "Fast CMOS Imaging with High Dynamic Range", 1997 IEEE Workshop on Charge-Coupled Devices and Advanced Image Sensors, pp. 1–4; and S. Decker et al., "Comparison of CCD and CMOS Pixels for a Wide Dynamic Range Area Imager", 1995 IEEE Workshop on Charge-Coupled Devices and Advanced Image Sensors, the reset gate voltage level is changed from an on-state to an off-state with a specified time response during integration. With this method the dynamic range is extended by skimming off charge to the reset drain for bright pixels so that the pixel does not saturate. This method has the disadvantages of requiring complicated timing to operate in an electronic shutter mode, and difficulty in discerning whether or not a particular signal level is due to skimming of charge or is simply the total integrated signal level.

From the foregoing discussion it should be apparent that there remains a need within the prior art for a device that retains provides extended dynamic range while retaining low noise, small pixel, single frame readout, and flexible transfer function.

SUMMARY OF THE INVENTION

According to the present invention, there is provided a solution to problems of the prior art. In the present invention, blooming behavior of CMOS based image sensors is used to provide extended intrascene dynamic range.

A first embodiment of the present invention utilizes the charge that blooms from the photodetector during integration. In prior art devices the signal level of the photodetector is limited in bright regions by removing and discarding the blooming charge. In the present invention the charge that blooms from the photodetector is integrated for a period that is controlled independently from the photodetector integration time, and this collected blooming charge is added to the photodetector signal charge in the readout of the pixel.

A second embodiment of the present invention provides extended dynamic range by utilizing the behavior of diminishing signal with increasing light level associated with the readout of CMOS APS under high illumination levels. This is done by performing 2 samples of the reset level that have different elapsed times between reset and measurement of the reset level, thus providing 2 different effective reset level integration times. By comparing the 2 measured reset levels, one can determine the effective signal level of the photodetector beyond the physical saturation signal of the photodetector. The difference determined in the two reset measured levels is used to if the pixel is operating in the diminishing high light signal region, or in low light standard linear signal region. Depending on the result, a different transfer function is applied to voltage output from the from readout of the photodetector of that pixel to provide an effective signal level for that pixel. If the light that is incident on that pixel is bright, and a difference in the 2 measured reset levels exceeds a predetermined threshold, a transfer function associated with the diminishing signal region will be used to calculate the photodetector value. If a difference in the 2 measured reset levels does not exceed a predetermined threshold value, then the standard linear transfer function will be used to identify that photodetector value. Additionally, the value of the measured difference can be used independently to calculate or determine the effective signal level or incident illumination level for that pixel.

According to the present invention, an active pixel sensor device that significantly increases the dynamic range of the device and can be used in current system designs is provided by a method and apparatus of employing an X-Y addressable MOS imager to obtain increased dynamic range wherein the X-Y addressable imager as a semiconductor based sensor having an array of pixels formed in rows and column, with a plurality of the pixels formed such that each pixel within the plurality of pixels has a photodetector, a sense node and a transfer mechanism for transferring charge from the photodetector to the sense node, and with a reset mechanism for resetting the sense node to a predetermined potential. An integration period for the photodetector is initiated through operation of the transfer mechanism followed by initiating an integration period for the sense node through operation of the reset mechanism and reading charge from both sense node and photodetector accumulated during their respective integration periods.

ADVANTAGEOUS EFFECT OF THE INVENTION

The invention has the following advantages. It provides for extending the dynamic range of a sensor that can easily be employed within current pixel and sensor architectures with little or no modification. Small pixel with high fill factor can detect signal level out to $40,000 \times V_{sat}$ single frame capture standard read-out.

BRIEF DESCRIPTION OF THE DRAWINGS

FIGS. 5(a–d) are an electrostatic diagrams illustrating the effect of diminishing signal behavior for the pixel as illustrated;

FIGS. 7(a–d) are an electrostatic diagrams illustrating the effect of diminishing signal behavior for the pixel as illustrated;

FIGS. 8(a–b) are diagrams illustrating the diminishing signal region; and

FIGS. 9(a–b) are diagrams illustrating the output of a sampled and held pixel.

DETAILED DESCRIPTION OF THE INVENTION

The first embodiment of the present invention utilizes collection of charge that blooms from the photodetector during integration. This is accomplished using the pixel shown in FIG. 1. This is a similar pixel design to that disclosed by Guidash et al in U.S. patent application 08/800,947. This pixel 10 comprises a photodetector 12 (preferably a pinned photodiode PD), a transfer gate TG 16, a floating diffusion FD 18, a light shield 8 over at least the floating diffusion 18, an input signal transistor and a reset transistor comprised of source floating diffusion 18, reset gate 17 and reset drain 19. A microlens 6 is provided to focus light onto the photodetector 12. Operation of the first embodiment of the present invention is shown in timing diagram of FIG. 2 for the pixel 10 of FIG. 1 resulting in the output signal transfer function shown in FIG. 3.

Figure 1:
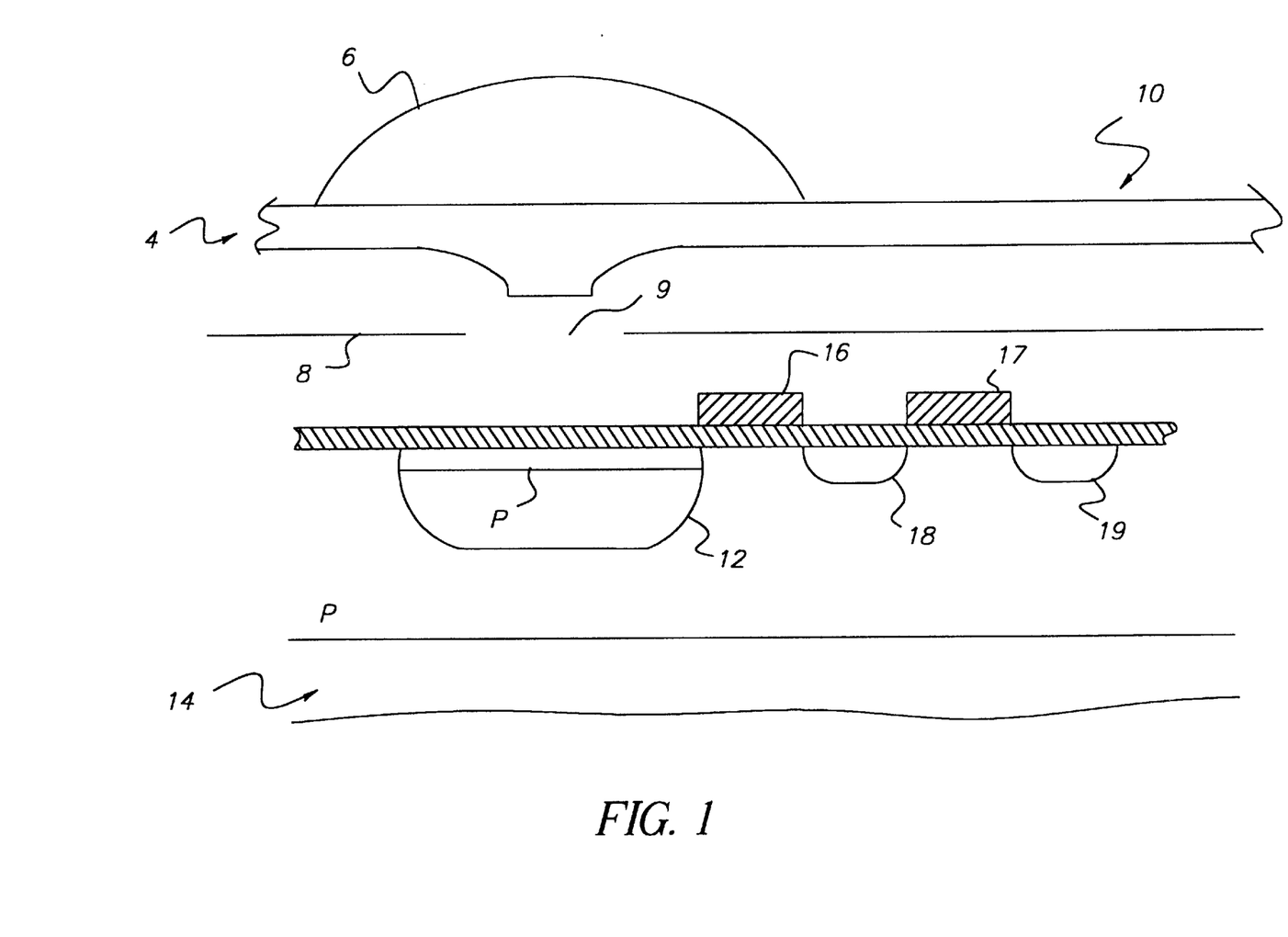
FIG. 1 is a diagram of a first embodiment of the present invention that extends the dynamic range by collecting charge that bloomed from the photodetector.
Figure 2A:
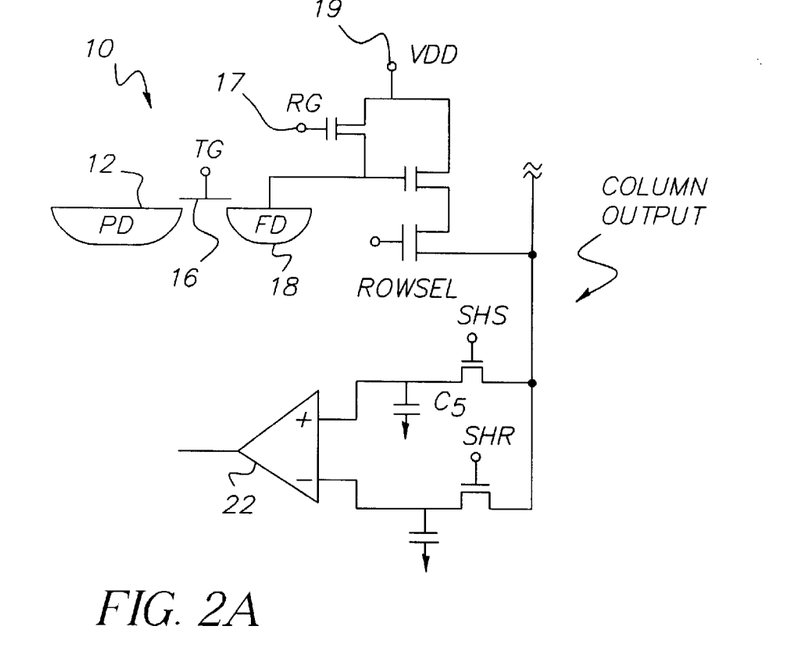
FIGS. 2a and 2c are diagrams illustrating the operation of the pixel shown in FIG. 1 on a column basis where photodetector charge is added, and an associated timing diagram.

Referring to FIG. 2a, which is diagram illustrating the operation of the pixel 10 shown in FIG. 1 on a column basis wherein charge from photodetector 12, and floating diffusion 18, is added by in the charge domain on the floating diffusion, with the combined charge from the photodetector and floating diffusion read out through amplifier 22, and an associated timing diagram. The pixel 10 is reset or initialized by transferring charge from the photodetector 12 to the floating diffusion 18 by activation of the transfer gate 16 (shown as signal TG) and the subsequent resetting of the floating diffusion 18 by the activation of reset gate 17, which resets the floating diffusion 18 to a predetermined potential. The photodetector integration time ($t_{intpd}$) commences when the transfer gate 16 is turned off after the initialization or reset sequence, at time $\tau_1$. The electrostatic potential of the transfer gate in its off state is set at a level deeper than 0 volts so that excess charge in the photodetector will bloom through the transfer gate region and into the floating diffusion 18. As photodetector integration time ($t_{intpd}$) proceeds, the photodetector 12 will fill up with photoelectrons. If the incident light is bright, the number of photoelectrons generated in that pixel will exceed the capacity of the photodetector 12. At this point the excess charge will spill into the floating diffusion 18. If the reset gate 17 is on when charge begins to spill onto the floating diffusion 18, this charge will be swept through the reset gate 17 region to reset drain 19 leaving the floating diffusion at the same predetermined potential, typically a threshold voltage below that of the reset drain 19 (VDD). If the reset gate 17 is off when charge begins to spill into the floating diffusion 18, then this charge will be collected in the floating diffusion 18. The amount of time that RG is turned off during the photodetector integration period is referred to as the floating diffusion integration time $t_{intfd}$.

At the end of desired photodetector integration time $t_{intpd}$, the signal charge in the photodetector 12 is transferred to the floating diffusion 18 by pulsing the transfer gate 16 on and off at time $\tau_2$. The signal level of the floating diffusion 18 is then sampled by SHS and held on capacitor $C_1$. If no blooming charge has been collected on the floating diffusion 18 during the floating diffusion integration time $t_{intfd}$, (i.e. a dark region of the image), then the signal charge on capacitor $C_1$ from the floating diffusion 18 comprises the charge collected in the photodetector 12 during integration. If blooming charge has been collected on the floating diffusion 18, then the signal charge on the capacitor $C_1$ from floating diffusion 18 comprises the charge collected in the photodetector 12 during photodetector integration time ($t_{intpd}$), plus the charge collected in the floating diffusion during the floating diffusion integration time. This floating diffusion integration time $t_{intfd}$, is the time elapsed from when reset gate 17 is turned off to when the signal charge is transferred from the photodetector 12 at time $\tau_2$. The floating diffusion integration time $t_{intfd}$ is controlled separately and independently from the photodetector integration time $t_{intpd}$.

Figure 3A:
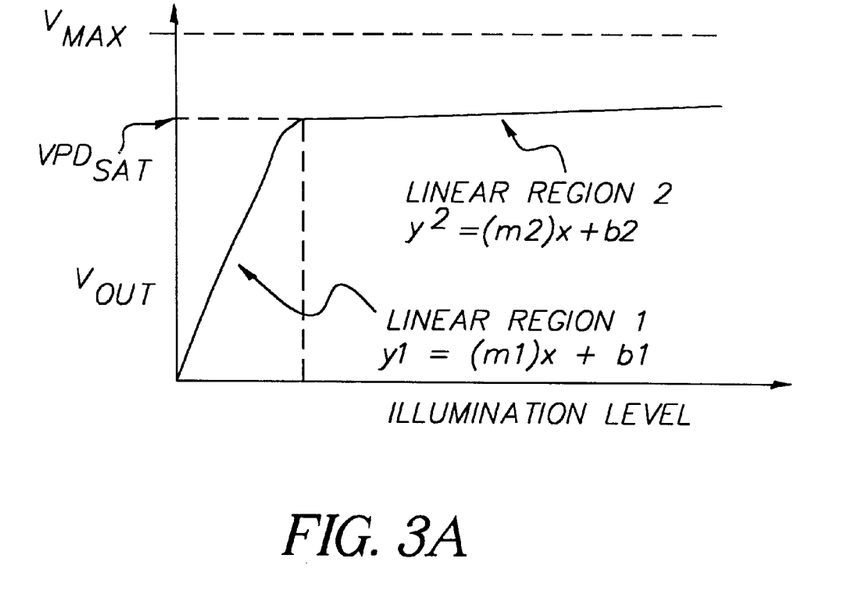
FIG. 3a illustrates a pair of transfer functions for the pixel in FIG. 1 operated by the timing diagrams shown in FIGS. 2(a–d) having a short floating diffusion integration time leading to a small slope for linear region 2.
Figure 3B:
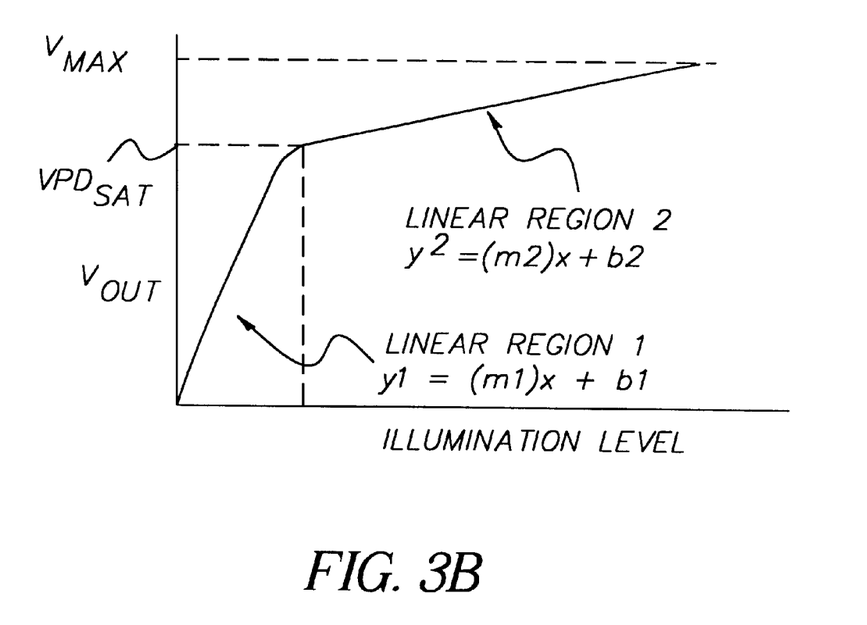
FIG. 3b illustrates a pair of transfer functions for the pixel in FIG. 1 operated by the timing diagrams shown in FIGS. 2(a–d) having a relatively longer floating diffusion integration time leading to a larger slope for linear region 2.

As a result of the operation described for FIG. 2a the sensor output response will be as shown in FIGS. 3a and 3b. The output response comprises 2 regions. For low light levels the output response will follow linear region 1. As the number of photoelectrons exceeds the capacity of the photodetector, this charge will be collected on the floating diffusion and added to the photodetector signal charge. In this case the pixel output response will follow region 2. The preferred embodiment provides a linear response in region 2, by the timing shown in FIG. 2a. A non-linear response could be generated by having a time varying reset gate potential level as described in the prior art reference by S. Decker et al., "A 256×256 CMOS Imaging Array with Wide Dynamic Range Pixels and Column-Parallel Digital Output", IEEE Journal of Solid State Circuits, Vol 33, No. 12, December 1998. In the preferred embodiment, the output response in region 2 is linear, and the slope is dependent on and directly proportional to the floating diffusion integration time $t_{intfd}$. The two FIGS. (3a and 3b) illustrate the 2 different slopes for region 2. The floating diffusion integration time in FIG. 3a is shorter than that for FIG. 3b. Consequently, the slope of region 2 in FIG. 3b. is greater than that for FIG. 3a.

Since the floating diffusion integration time $t_{intfd}$ is known, the effective signal level of the pixel can be determined by Equation 6.

$$Veff=Vout \text{ for } Vout<Vpdsat \quad Veff=Vpdsat+(Vout-Vpdsat)(t_{pdint}/t_{fdint}) \text{ for } Vout/Vpdsat \quad \text{Equation 6}$$

Since the ratio of the photodetector integration time $t_{intpd}$ to the floating diffusion integration time $t_{intfd}$ can be made large, Veff can be increased substantially over the signal limited by the photodetector capacity. Hence, the dynamic range is extended. Additionally, the maximum voltage level, Vmax, which is determined by the floating diffusion charge capacity can be larger than that of the photodetector capacity by controlling the capacitance of the floating diffusion. It is also possible to display the sensor output signal directly without determining the effective signal level from region 2. This still provides extended intrascene dynamic range by mapping and directly displaying a larger incident illuminant range into the directly detectable signal voltage range. Also, the level of Vpdsat can be programmed by setting the off level of the transfer gate 16 to the desired level.

Figure 2B:
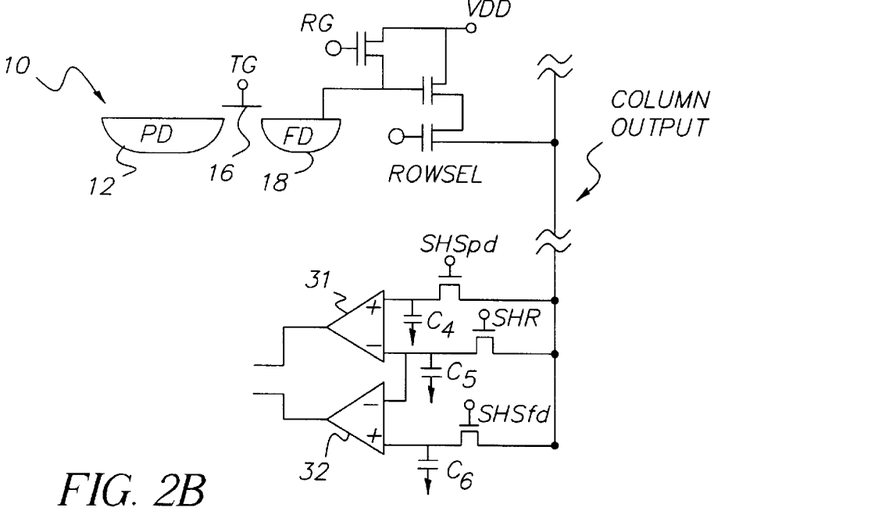
FIGS. 2b and 2d are diagrams illustrating the operation of the pixel shown in FIG. 1 on a column basis where photodetector voltage is added, and an associated timing diagram.
Figure 2C:
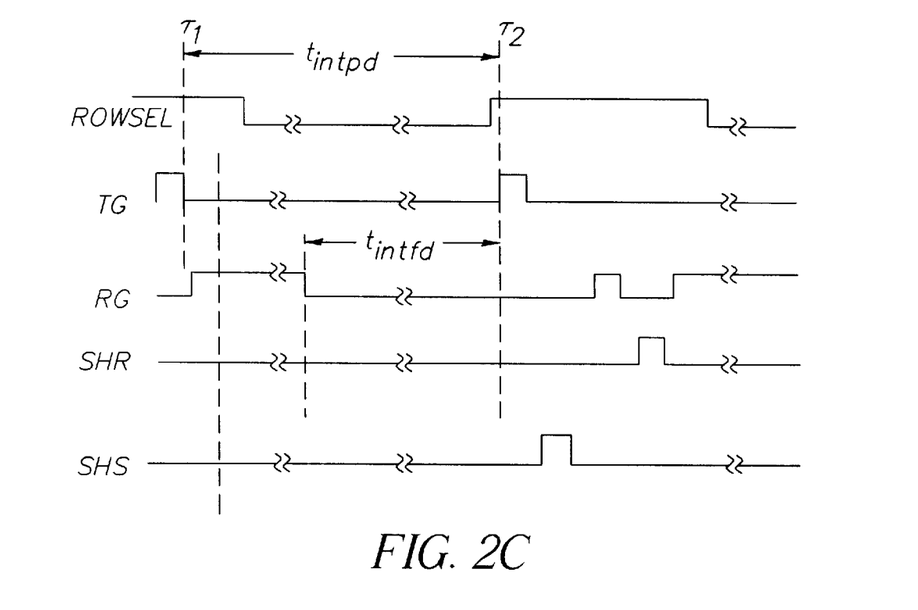
Figure 2D:
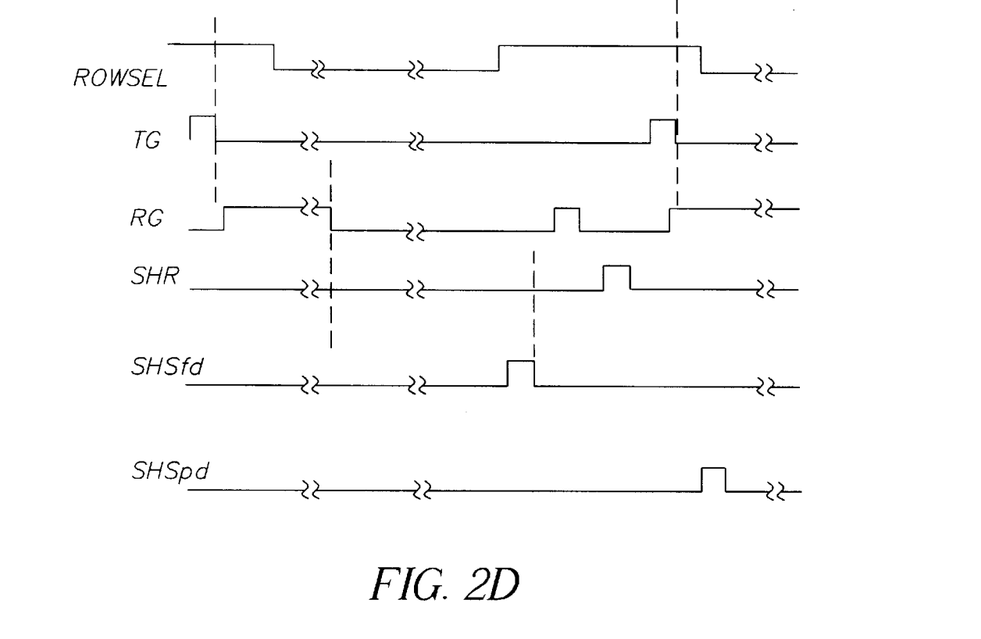

The timing shown in FIG. 2a shows a single readout of the total combined charge on the floating diffusion that comprises the photodetector signal and the collected blooming charge. The signal is read first followed by a reset and then a measurement of the reset level. This is an uncorrelated double sample readout, which adds temporal reset noise to the signal. It is possible to accomplish readout of the photodetector signal level and floating diffusion blooming charge level by performing 2 readouts. This is shown in FIG. 2b. In this manner the level of blooming charge collected on the floating diffusion 18 is sampled and held by pulsing $SHS_{fd}$ which places the blooming charge on Capacitor $C_4$, followed by a reset of the floating diffusion 18 by RG and a sample and hold of the reset level by SHR which places the reset level on Capacitor $C_5$. Charge is then transferred from the photodetector 12 to the floating diffusion 18 and that signal level is then sampled and held by $SHS_{pd}$ and placed on Capacitor $C_6$. The present invention envisions a differential readout for the stored blooming charge on capacitor $C_4$ and the reset level on capacitor $C_5$ via differential amplifier 31, and a second differential readout for the stored signal charge on capacitor $C_6$ and the reset level on capacitor $C_5$ via differential amplifier 32, thus providing true correlated double sampling for the photodetector signal level. The final output signal can then be determined by several means. One is reading the signals from the 2 differential amplifiers 31 and 32 separately providing 2 signal values per pixel that can be added off-chip. A second embodiment is accomplished by providing the signals as inputs to a $3^{rd}$ differential amplifier and reading the signal out as a single level per pixel. This readout method of combining the signal in the voltage domain also provides a larger Vmax than combining the signals in the charge domain. This is because the floating diffusion does not have to hold the photodetector signal and blooming signal simultaneously. Hence the Vmax is extended to be the full floating diffusion capacity plus the photodetector capacity.

Since this method utilizes differential readout of the pixel with respect to a reference reset level, the pixel offset noise is cancelled. Additionally the dynamic range is extended without any additional components in the pixel, so that it can be accomplished with small pixels that are practical for low cost consumer digital imaging applications. With this approach pixel read noise will be increased by KTC due to the reset level being uncorrelated to the signal level. This will be typically less than 30 electrons and is small compared to the gain in effective signal level.

The second embodiment of the present invention also utilizes blooming behavior to extend dynamic range. In CMOS APS and PPS devices it is pointed out that as the incident light level becomes extremely bright, the output signal determined from the difference between the signal level and a reset level is perceived to decrease with increasing light levels, eventually reaching a "black" level. This diminishing signal behavior is due to the effect of the reset level decreasing as a result of charge accumulating on the charge to voltage conversion node, typically referred to as a sense node, during the time between reset and when the reset level is sampled and held. This occurs either by blooming charge from a separate photodetector being collected during on the sense node in the case of a 4 transistor APS, or by accumulation of electrons in the photodetector that also functions as the sense node in the case of 3 transistor APS pixels, or in the case of PPS pixels. If uncorrected, this diminishing signal effect with increasing incident light levels may be undesirable.

Figure 4:
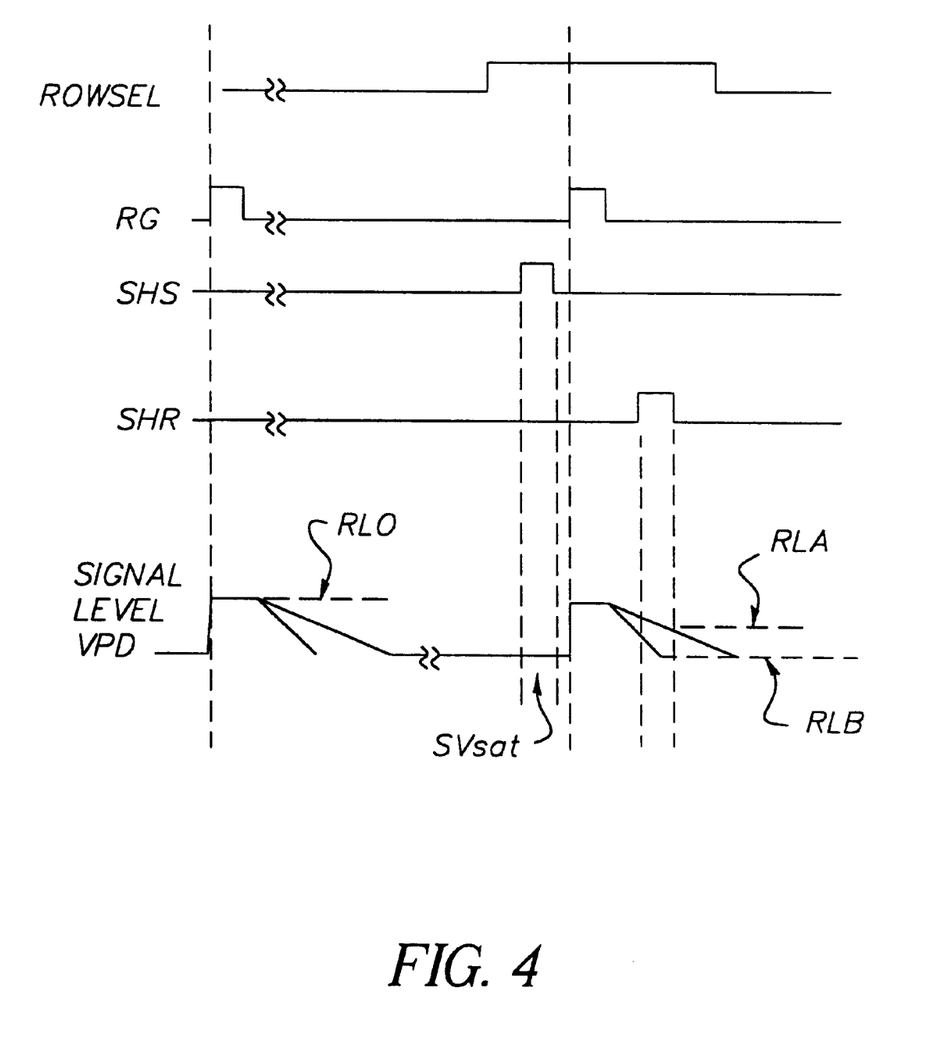
FIG. 4 is a timing diagram used to illustrate the diminishing signal behavior shown in FIGS. 5(a–d)
Figure 5A:
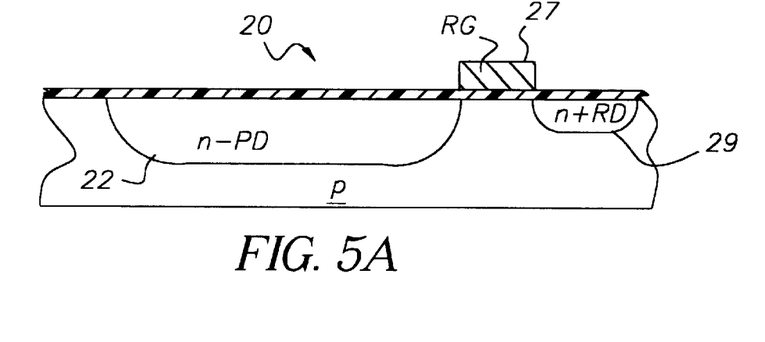
Figure 5B:
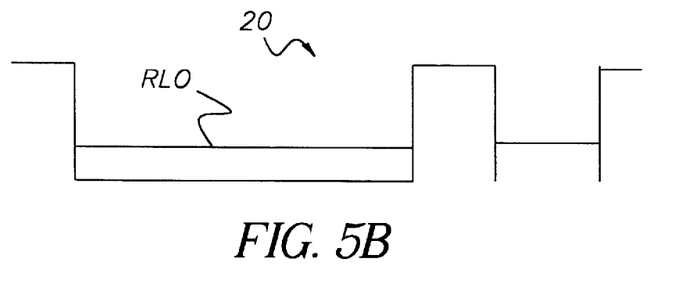
Figure 5C:
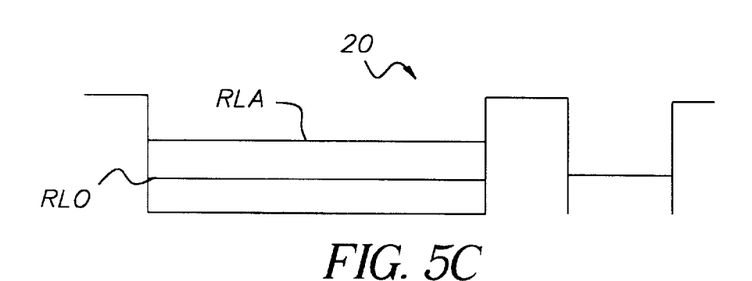
Figure 5D:
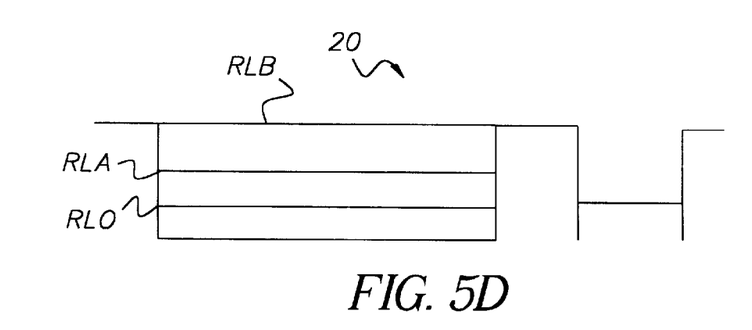
Figure 6:
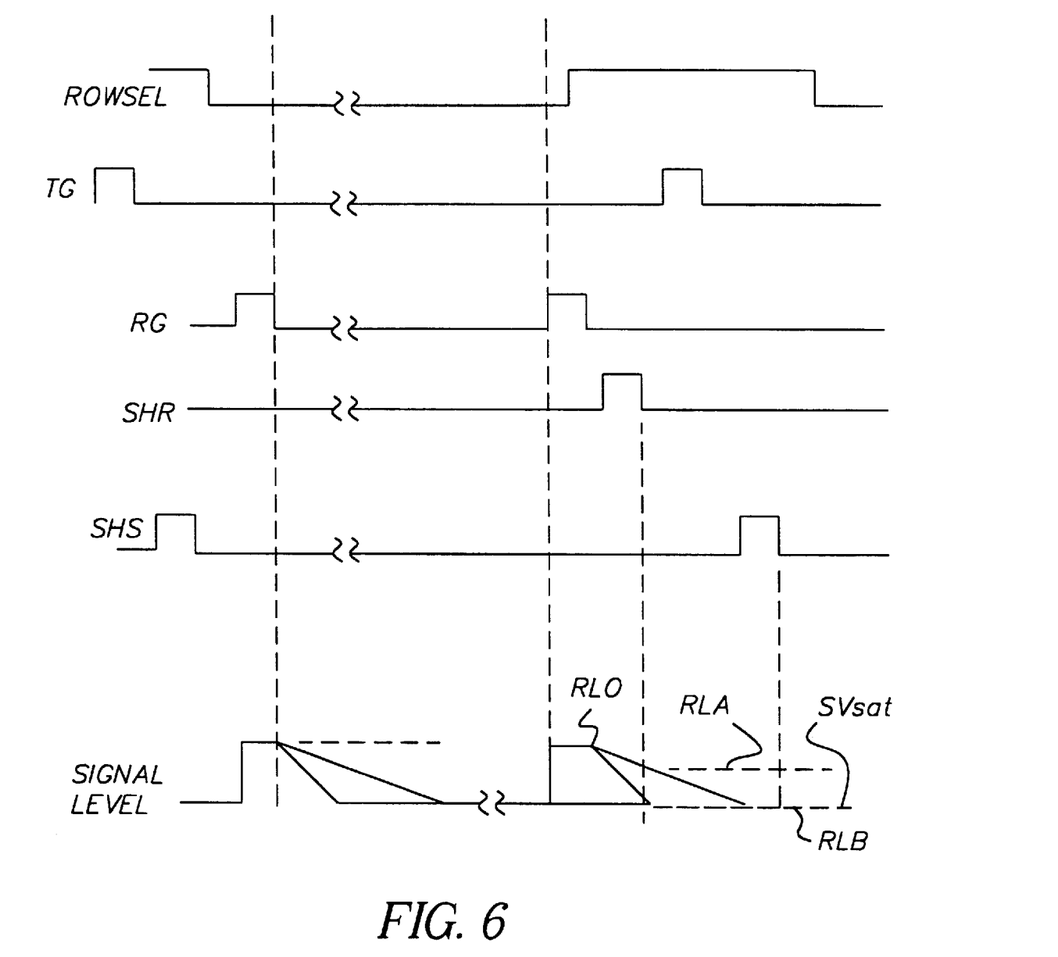
FIG. 6 is a timing diagram used to illustrate the diminishing signal behavior shown in FIGS. 7(a–d)
Figure 7A:
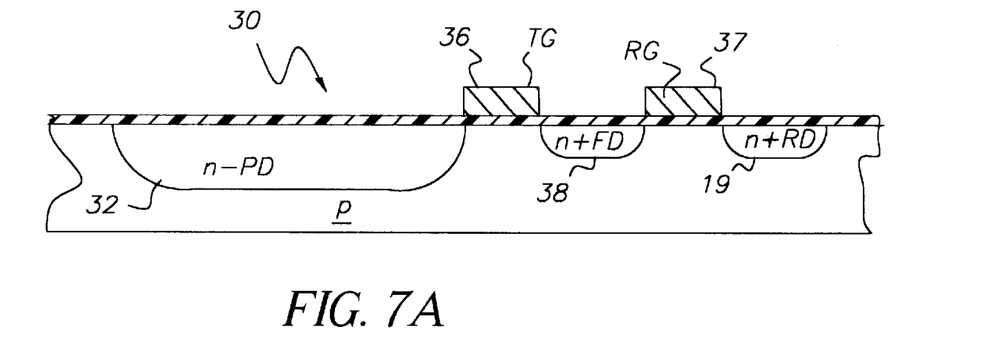
Figure 7B:
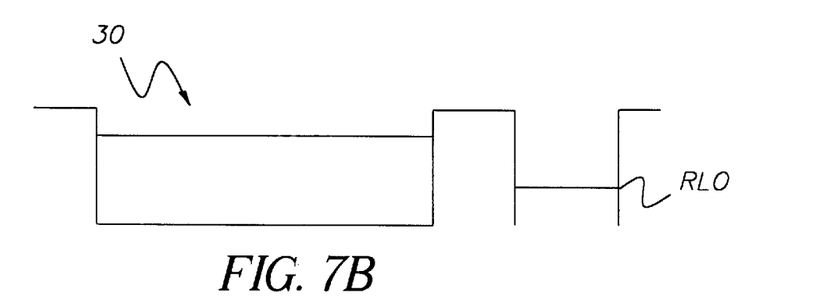
Figure 7C:
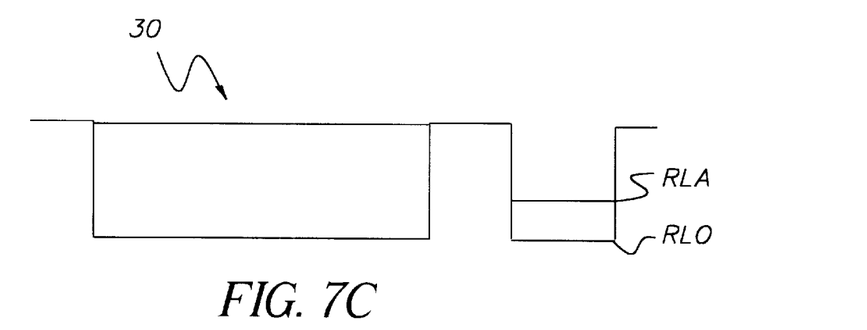
Figure 7D:
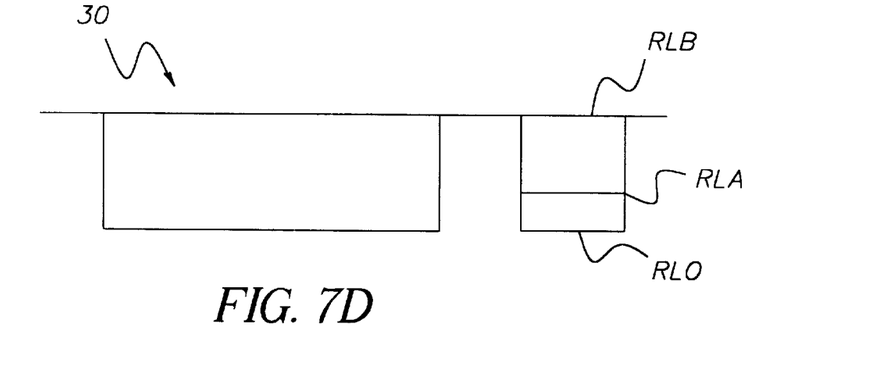

Cross sectional diagrams of the relevant region of pixels envisioned to operate under the second embodiment of the present invention are shown schematically in FIGS. 5a–d and 7a–d with corresponding timing diagrams of FIGS. 4 and 6. The pixel 20 shown in FIGS. 5a–d and the corresponding timing diagram of FIGS. 4 are for the case of either a 3 transistor APS device where the photodetector serves as the charge to voltage conversion node, and also or for the case of a PPS device. The pixel 30 shown in FIGS. 7a–d and the corresponding timing diagram of FIGS. 6 are for the case of an APS where the charge to voltage conversion node (floating diffusion 38) is separate and isolated from the photodetector 32.

Figure 8A:
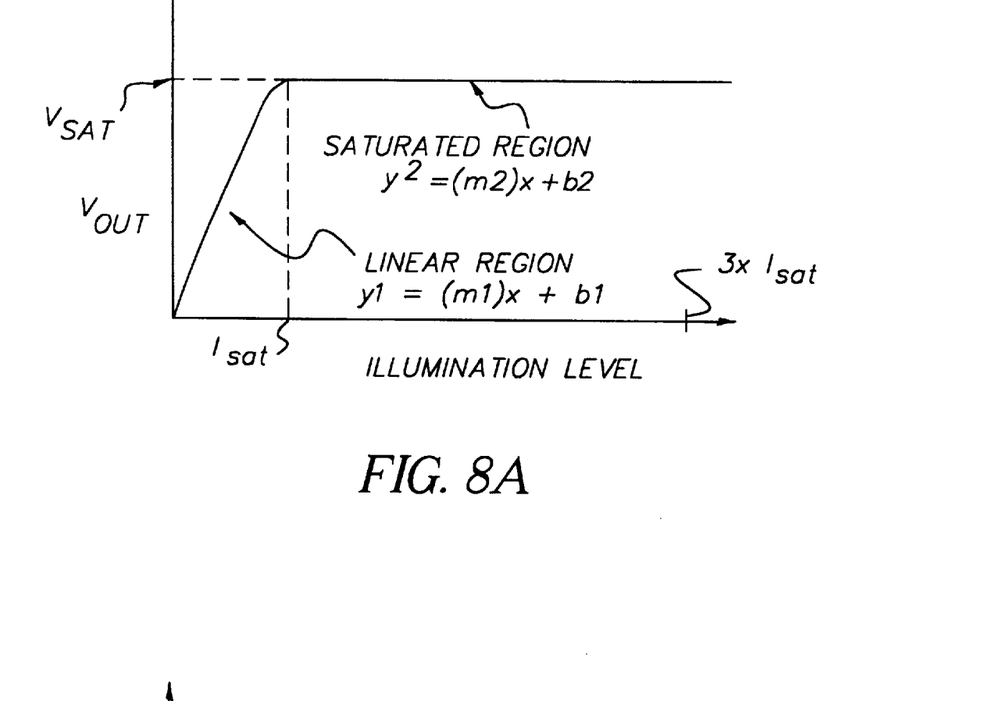

Referring to FIGS. 4 and 5a–d, which is the case of 3 transistor APS devices and PPS devices, the pixel 20 is initialized by resetting the photodetector 22 when RG 27 is pulsed on and off. Integration of signal in the photodetector now commences. As integration proceeds the electrostatic potential of the photodetector VPD decreases until the photodetector 22 has completely filled up with photoelectrons. At this point the VPD is approximately 0 volts. The signal level of the photodetector 22 is then sampled and held by strobing SHS. Next the photodetector is reset by strobing RG 27 in order to provided a reference level differential readout of the signal from photodetector 22. The time elapsed between the reset and sample and hold of the reset level is typically a few $\mu$sec. If the incident light level during this elapsed time is low, the reset level will not change appreciably and will be extremely close to the nominal reset level RL0. If this incident light is very bright, the reset level can change during this elapsed time if the sensor is not shielded from the incident light. The example seen in FIGS. 5a–d is for a very bright incident light level that causes the photodetector voltage VPD to go to reset level RLA. Since the readout of the output signal level is determined by the difference between the signal level and the reset level, the perceived output signal level will decrease because the full photodetector level is compared against RLA rather than RL0. If the incident light level is bright enough to completely fill the photodetector in the time between reset and sample and hold of the rest level, the photodetector will reach a reset level RLB. In this case the difference between the sampled and held signal level and the sampled and held reset level is zero, producing a black or dark image. This produces a diminishing signal region with increasing incident light intensity as shown in FIGS. 8a and 8b.

Referring to FIGS. 6 and 7a–d, which is for the case of 4 transistor APS devices, the same effect occurs. As the incident light level becomes bright enough the photodetector 32 fills up and excess electrons spill into the floating diffusion 38, consequently decreasing the reset level and the differentially read out signal level in a manner similar to that described for FIGS. 4 and 5a–d.

Figure 8B:
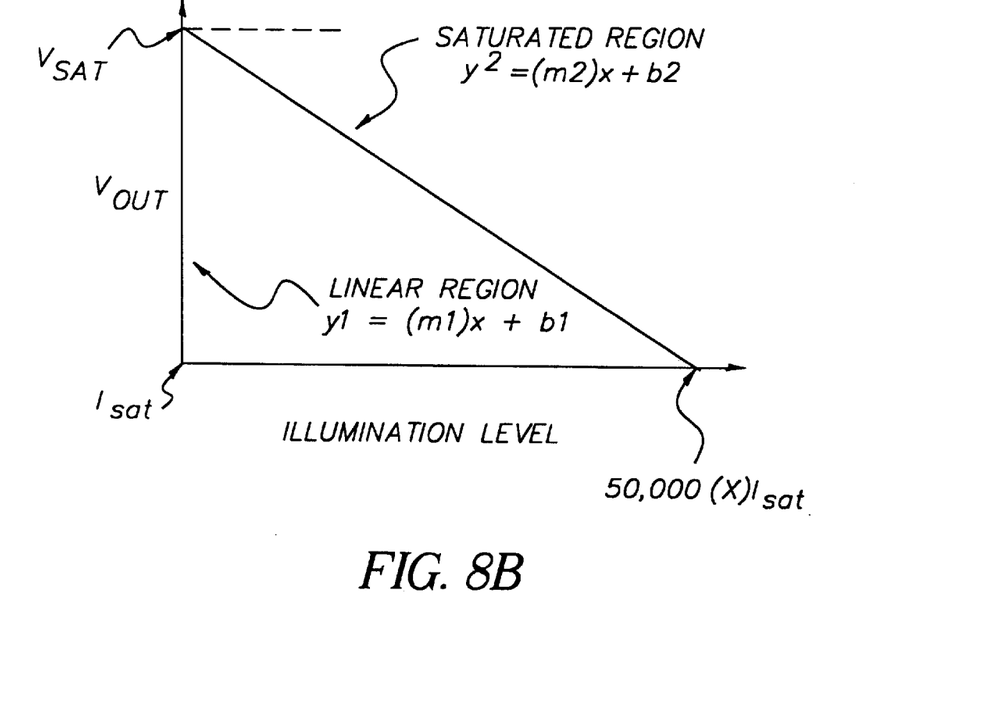

However, measurements of this diminishing signal level effect show that the transfer function is very linear and reaches a black level at incident light levels that are 20,000× to 50,000× the normal saturation exposure, Isat, as shown in FIG. 8b. In FIG. 8a, the x-axis scale extends from no illumination to 3× times the saturation exposure. With this x-axis scale it is possible to discern the linear region output response of the pixel prior to saturation. This is the region between no illumination and Isat. The x-axis scale is changed in FIG. 3b to extend from no illumination to 50,000 times Isat. With this scale it is easier to discern the output response of the sensor in the saturated region, but difficult to discern the region prior to saturation shown in FIG. 3a. In the output response of the sensor in the saturated region, the output signal diminishes linearly, or by some other characterized and empirically known transfer function, until reaching ~50,000 times Isat, where the output signal reaches 0 volts and appears as a black or dark signal.

The new concept presented with the present invention is to use this diminishing signal region to determine the "effective signal level" to extend dynamic range. The "effective reset integration time" for this behavior is simply elapsed time between the falling edge of the reset of the charge to voltage conversion node and the falling edge of the sample and hold of the reset level, as shown in FIG. 4 and FIG. 6. The signal change in this small integration time can be ascertained by having two reset sequences that are sampled and held with different effective integration times. If there is a difference between the 2 reset levels that exceed a predetermined threshold, then it is known that pixel is in the diminishing signal region of the response curve. This could also be done by comparing a single reset level to a reference reset level that is generated from a dark reset. Once it is determined that the pixel is in the diminishing region of the response curve, the incident illumination level can be determined from the specific measured transfer function provided by the diminishing signal region of the sensor. Thus incident illumination levels from no illumination up to 50,000× the saturation exposure can be detected by the sensor, providing extended dynamic range. Additionally, the effective signal level could be determined from the measured difference in the two reset level by using equation (7)

$$V_{\mathit{eff}} = \Delta V_{reset}\left(\frac{t_{exp}}{t_{int\,r}}\right) + V_{sat} \quad \text{where} \quad \text{Equation 7}$$

$$\Delta V_{reset} = V_{reset\,dark} - V_{reset\,illum.}$$

where $t_{exp}$=exposure time and $t_{int\,r}$=effective reset integration time.

Figure 9A:
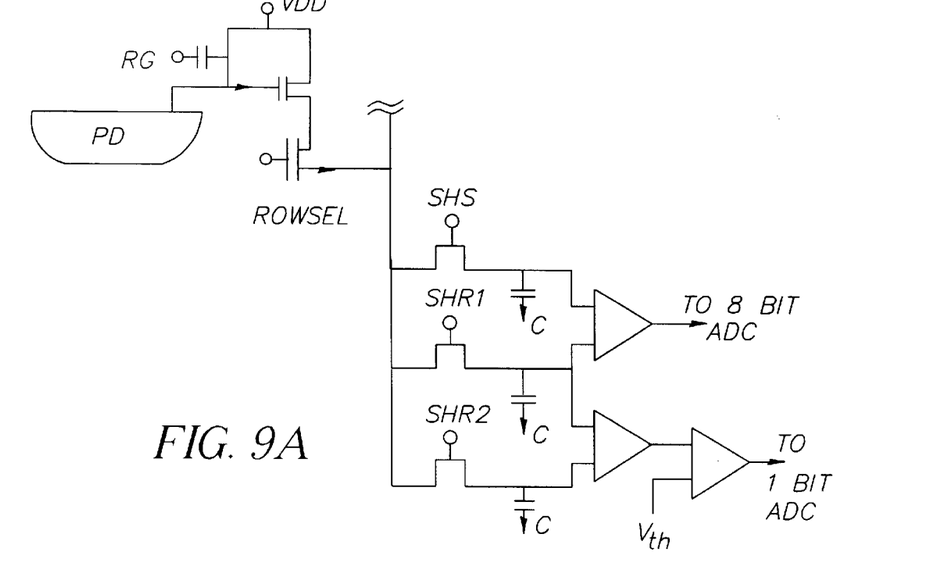
Figure 9B:
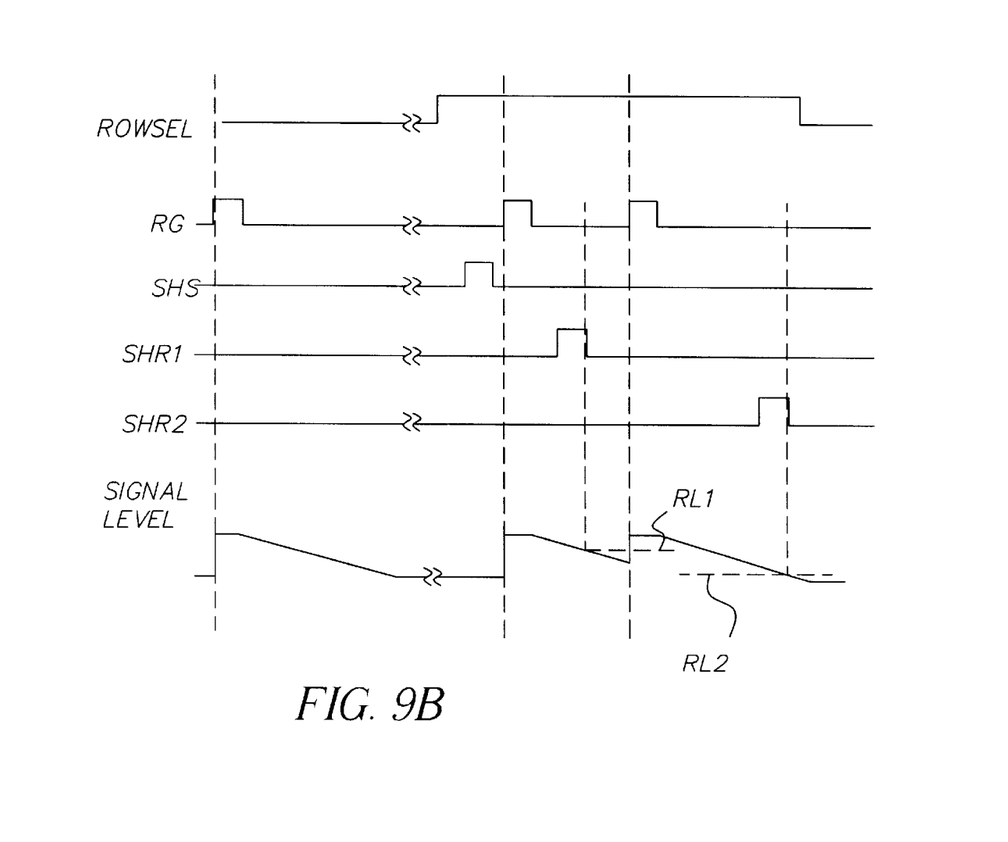

Application of the saturated region transfer function, or calculation of the effective signal level as described in equation 7, could be accomplished outside of the image sensor via system software or hardware, or on the sensor in the analog or digital domain. One embodiment of this concept is shown in FIGS. 9a–b. Referring to FIGS. 9a–b, a comparator with a programmable threshold is used to determine if there is a difference between the 2 reset levels with different elapsed times between reset and sample and hold of the reset level. The pixel output signal level is read in a manner similar to that described in prior art; the sampled and held photodetector signal level is read out differentially with respect to reset1, and digitized to N bits, (8 shown in this example). The output of this comparator with reset1 and reset2 as inputs is then used as a transfer function bit. A "zero" transfer function bit indicates that the 8 bit photodetector signal level should be used as is. A "one" transfer function bit indicates that the 8 bit photodetector signal level should be calculated using the 8 bit output using the saturated region transfer function. The timing for this readout operation is also shown in FIGS. 9a–b for the pixel shown in FIGS. 5a–d. After the photodetector integration time has elapsed the floating diffusion is reset and the reset level is sampled and held. This is reset1 and has an elapsed reset integration time 1. Next the charge in the PD is transferred to the floating diffusion and the signal level is sampled and held. Next, the FD is reset and the reset level is sampled and held provided reset2, with an elapsed reset integration time 2 that is different than that for reset1.

The operation occurs in a similar manner for APS pixels where the PD functions as the sense node or for PPS pixels, except that the readouts occur in the sequence of read signal level, reset, read reset1, wait for an desired elapsed time, read reset2.

Additionally, rather than using a comparator to determine if there is a predetermined difference between reset1 and reset2, the actual value of the differences in reset levels could be read out in a similar manner to that used to determine the value of (signal−reset1). This value of (reset2−reset1) could then be used to determine the effective signal level using equation 7. A comparison could be done to provide a flag bit to determine which value, either signal−reset1, or reset2−reset1 to read out through the 8 bit ADC.

PARTS LIST 10 pixel
12 photodetector
14 substrate
16 transfer gate
17 reset gate
18 floating diffusion
19 reset drain
20 pixel
22 photodetector
24 substrate
27 reset gate
28 floating diffusion
29 reset drain
20 pixel
22 photodetector
24 substrate
26 transfer gate
27 reset gate
28 floating diffusion
29 reset drain

What is claimed is:

1. A method of using an X-Y addressable MOS imager to obtain increased dynamic range comprising the steps of:

providing the X-Y addressable imager as a semiconductor based sensor having an array of pixels formed in rows and column, with a plurality of the pixels formed such that each pixel within the plurality of pixels has a photodetector, a sense node and a transfer mechanism for transferring charge from the photodetector to the sense node, with a reset mechanism for resetting the sense node to a predetermined potential;

initiating an integration period for the photodetector through operation of the transfer mechanism;

initiating an integration period for the sense node through operation of the reset mechanism; and reading charge from both sense node and photodetector accumulated during their respective integration periods.

2. The method of claim 1 wherein the step of initiating an integration period for the sense node further comprises collecting charge that blooms from the photodetector on to the sense node.

3. The method of claim 2 wherein the step of collecting blooming charge on the sense node further comprises controlling the integration time that blooming charge is collected on the sense node.

4. The method of claim 1 wherein the step of initiating an integration period for the sense node further comprises setting the transfer mechanism to a predetermined potential to set a potential level for the photodetector at which the sense node begins collecting blooming charge.

5. The method of claim 1 wherein the step of reading charge from both sense node and photodetector accumulated during their respective integration periods further comprises reading a combined charge from both integration periods.

6. The method of claim 1 wherein the step of reading charge from both sense node and photodetector accumulated during their respective integration periods further comprises reading individual charges from both integration periods.

7. The method of claim 1 wherein the providing step further comprises providing sample and hold circuitry for each of the columns.

8. The method of claim 7 wherein the sample and hold circuitry further comprises a reset sampling mechanism and a signal sampling mechanism.

9. The method of claim 7 wherein the sample and hold circuitry further comprises in addition to the reset sampling mechanism and the signal sampling mechanism, a blooming sampling mechanism.

10. The method of claim 1 farther comprising the step of applying a predetermined set of transfer functions to charge read during the reading.

11. The method of claim 1 further comprising the step of identifying which transfer function is applicable to the read charge.

12. The method of claim 11 further comprising means responsive to the step of identifying for applying the transfer function to ascertain the light intensity incident on the photodetectors.

13. A method of using an imager to provide increased dynamic range comprising the steps of:
providing the imager on a semiconductor based substrate having a sensor array formed within the substrate with a plurality of the pixels in the array being configured such that each of the pixels has photodetector coupled to a sense node through a transfer mechanism, the sense node being operatively connected to a reset mechanism;
creating a sense node integration period and a photodetector integration period within each of the plurality of pixels during a signal frame period wherein the sense node integration period collects charge on the sense node that has bloomed from the photodetector during the photodetector integration period;
sampling the potential level accumulated on the sense node;
firstly applying a predetermined set of transfer functions to identify signal levels of the photodetectors;
identifying which transfer function is applicable to the sampled potential; and
secondly applying the transfer function to ascertain the light intensity from the photodetectors.

14. The method of claim 13 wherein the sampling step further comprises sampling charge that blooms out of the photodetector within sense node integration period.

15. The system of claim 13 wherein the step of sampling samples potential levels from the sense node that is a summation of bloomed charge accumulated on the sense node and integrated charge accumulated on the photodetector.

16. The method of claim 13 wherein the applying step applies linear transfer functions.

17. The method of claim 13 wherein the applying step applies the a non-linear transfer function.

18. The method of claim 13 wherein the sampling step further comprises reading a combined sum of the charge that has bloomed plus accumulated charge that has been transferred to the sense node employing a single read.

19. The method of claim 13 wherein the sampling step further comprises:
sampling and holding charge that has bloomed from the photodetector to the sense node;
resetting the sense node and sampling and holding the reset value;
transferring integrated charge from the photodetector to the sense node and sampling and holding the integrated charge from the photodetector; and
combining the sampled and held bloomed charge, the reset value and the integrated charge.

20. An X-Y addressable MOS imaging system comprising:
a semiconductor based image sensor having an array of pixels with a plurality of the pixels such that each pixel within the plurality of pixels has a photodetector and a sense node with means for resetting both the photodetector and the sense node to a predetermined potential;
means for transferring charge from the photodetector to the sense node;
means for collecting blooming charge on the sense node;
means for controlling the time that blooming charge is collected on the sense node;
means for reading accumulated signal level of both the photodetector signal and the bloomed charge collected on the sense node; and
means for measuring the reset level of the sense node.

21. The system of claim 20 further comprising a measuring mechanism connected to the photodetector to measure charge that blooms out of the photodetector within a predetermined time period.

22. The system of claim 20 wherein each of the plurality of pixels has a transfer mechanism between the photodetector and a sense node, wherein the sense node is operatively coupled to the reset mechanism.

23. The system of claim 22 wherein the means for reading further comprise a signal connected to the transfer mechanism that sets a potential threshold that allows charge in excess of that threshold to bloom onto the sense node.

24. The system of claim 23 wherein the means for measuring further comprises means for reading a summed potential of charge that has bloomed plus accumulated charge that has been transferred to the sense node.

25. The system of claim 23 wherein the means for measuring further comprise means for transferring charge from the photodetector onto the sense node containing the bloomed charge and reading a combined sum of the charge that has bloomed plus accumulated charge that has been transferred to the sense node employing a single read.

26. The system of claim 23 wherein the means for measuring further comprise means for reading bloomed charge from the sense node, resetting the sense node followed by reading accumulated charge transferred from the photodetector to the sense node.

27. The system of claim 20 wherein the means for controlling blooming time further comprises creating multiple integration periods including a first integration period for the photodetector and a second integration period for the sense node.

28. The system of claim 27 wherein the first integration period is controlled by a transfer gate between the photodetector and the sense node, and the second integration period is controlled by the reset mechanism and the transfer gate.

29. The system of claim 20 wherein the transfer gate has a signal applied to it that can adjust a blooming level between the photodetector and the sense node.

30. An X-Y addressable MOS imager system comprising:
a semiconductor based substrate having an active pixel sensor array formed within the substrate;
a plurality of the pixels in the array being configured such that each of the pixels has photodetector coupled to a sense node through a transfer mechanism, the sense node being operatively connected to a reset mechanism;
means for creating a sense node integration period and a photodetector integration period within each of the plurality of pixels during a signal frame period wherein the sense node integration period collects charge on the sense node that has bloomed from the photodetector during the photodetector integration period;
a predetermined set of transfer functions used to identify signal levels of the photodetectors;

sampling means for reading a potential level accumulated on the sense node;

determination means for identifying which transfer function is applicable to the sampled potential; and means responsive to the determination means for applying the transfer function to ascertain the light intensity from the photodetectors.

31. The system of claim 30 wherein the sampling means further comprises means for sampling the photodetector to measure charge that blooms out of the photodetector within a photodetector integration period.

32. The system of claim 30 wherein each of the plurality of pixels has the potential level sampled from the sense node and the sampled level is a summation of bloomed charge accumulated on the sense node and integrated charge accumulated on the photodetector.

33. The system of claim 30 wherein each of the plurality of pixels has one of the predetermined transfer functions applied to the potential level sampled from the sense node and the transfer function is a linear function.

34. The system of claim 30 wherein each of the plurality of pixels has one of the predetermined transfer functions applied to the potential level sampled from the sense node and the transfer function is a non-linear function.

35. The system of claim 23 wherein the means for measuring further comprise means for transferring charge from the photodetector onto the sense node containing the bloomed charge and reading a combined sum of the charge that has bloomed plus accumulated charge that has been transferred to the sense node employing a single read.

36. The system of claim 30 wherein the sampling means further comprises:

a read circuit electrically coupled to the sense node that can capacitively sample store bloomed charge from the sense node;

a resetting timing circuit for sequentially resetting the sense node after the bloomed charge has been capacitively sampled; and wherein the read circuit being operatively coupled to switch means for alternating capacitors used to store the bloomed charge and the stored photodetector.

37. The system of claim 30 wherein the means for creating the sense node integration period and the photodetector integration period further comprises means for controlling a blooming time period wherein the photodetector integration period is allowed bloom on to the sense node the photodetector.

38. The system of claim 30 wherein the photodetector integration period is controlled by a transfer gate between the photodetector and the sense node, and the sense node integration period is controlled by the reset mechanism and the transfer gate.

39. The system of claim 30 wherein the transfer gate has a signal applied to it that can adjust a blooming level between the photodetector and the sense node.

* * * * *